(12) United States Patent
Kim et al.

(10) Patent No.: US 9,799,786 B2
(45) Date of Patent: Oct. 24, 2017

(54) SUPPORT FRAME AND PHOTOVOLTAIC POWER GENERATION SYSTEM INCLUDING THE SAME (71) Applicant: LG ELECTRONICS INC., Seoul (KR)

(72) Inventors: Jeongshik Kim, Seoul (KR); Hyunrok Mun, Seoul (KR); Sanghwan Park, Seoul (KR); Hwanyeon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 695 days.

(21) Appl. No.: 14/011,417

(22) Filed: Aug. 27, 2013

(65) Prior Publication Data

US 2014/0060624 A1 Mar. 6, 2014

(30) Foreign Application Priority Data

Aug. 28, 2012 (KR) .................. 10-2012-0094368

(51) Int. Cl.
*F24J 2/52* (2006.01)
*H01L 31/042* (2014.01)
*H02S 30/10* (2014.01)
*F24J 2/54* (2006.01)

(52) U.S. Cl.
CPC ......... *H01L 31/0424* (2013.01); *F24J 2/5211* (2013.01); *F24J 2/5233* (2013.01); *F24J 2/5264* (2013.01); *H02S 30/10* (2014.12); *F24J 2002/5486* (2013.01); *Y02E 10/47* (2013.01)

(58) Field of Classification Search
None
See application file for complete search history.

(56) References Cited

U.S. PATENT DOCUMENTS

| 4,237,867 | A | * | 12/1980 | Bauer | F24J 2/28 126/650 |
| 4,261,330 | A | * | 4/1981 | Reinisch | F24J 2/26 126/623 |
| 5,125,608 | A | * | 6/1992 | McMaster | F24J 2/5232 126/570 |
| 5,703,154 | A | * | 12/1997 | Davis | C08K 5/0025 524/525 |
| 6,281,425 | B1 | * | 8/2001 | Price | H02J 7/355 136/244 |
| 6,294,724 | B1 | * | 9/2001 | Sasaoka | H01L 31/048 136/244 |

(Continued)

FOREIGN PATENT DOCUMENTS

CN 1265523 A 9/2000
CN 201263131 Y 6/2009
(Continued)

OTHER PUBLICATIONS

Translation of FR 2880437 B1, Charlier.*

*Primary Examiner* — Magali P Slawski
(74) *Attorney, Agent, or Firm* — Dentons US LLP (57) ABSTRACT A support frame is for a photovoltaic power generation system. The support frame includes a frame member including a first portion positioned at one surface of a solar cell panel and a second portion positioned at the other surface of the solar cell panel, wherein the second portion is openably coupled to the first portion.

16 Claims, 6 Drawing Sheets

(56) References Cited

U.S. PATENT DOCUMENTS

| | | | |
|---|---|---|---|
| 6,353,531 B1* | 3/2002 | Howell | G06F 1/1601 345/102 |
| 6,870,089 B1* | 3/2005 | Gray | H01L 31/042 136/200 |
| 2002/0003197 A1* | 1/2002 | MacEachern | F16M 11/10 248/346.01 |
| 2002/0028716 A1* | 3/2002 | Gormley | E04H 12/2246 473/423 |
| 2003/0075210 A1* | 4/2003 | Stollwerck | B32B 17/10009 136/243 |
| 2005/0000562 A1 | 1/2005 | Kataoka et al. | |
| 2007/0257410 A1* | 11/2007 | Toh | F16F 1/3605 267/153 |
| 2009/0283136 A1* | 11/2009 | Munch | F24J 2/5228 136/251 |
| 2010/0269888 A1 | 10/2010 | Johnston, Jr. | |
| 2011/0203637 A1* | 8/2011 | Patton | F24J 2/5205 136/244 |
| 2011/0290685 A1* | 12/2011 | Kenney | G06F 1/1656 206/320 |
| 2012/0080075 A1 | 4/2012 | Hardikar et al. | |
| 2013/0263915 A1 | 10/2013 | Snidow | |

FOREIGN PATENT DOCUMENTS

| | | | |
|---|---|---|---|
| CN | 101662240 A | 3/2010 | |
| CN | 201562683 U | 8/2010 | |
| CN | 101943497 A | 1/2011 | |
| DE | 202010015848 U1 | 2/2011 | |
| EP | 1813738 A1 | 8/2007 | |
| FR | 2880437 B1 * | 8/2007 | ........... G06F 1/1616 |
| JP | 3060887 U | 9/1999 | |
| JP | 2000269535 | 9/2000 | |
| JP | 2003282918 | 10/2003 | |
| JP | 2006307627 | 11/2006 | |
| JP | 2009246209 | 10/2009 | |
| JP | 2012082642 | 4/2012 | |
| JP | 2012-160764 | 8/2012 | |
| KR | 10-0222965 | 10/1999 | |
| KR | 20-0434068 | 12/2006 | |
| KR | 10-2012-0051816 | 5/2012 | |

* cited by examiner

SUPPORT FRAME AND PHOTOVOLTAIC POWER GENERATION SYSTEM INCLUDING THE SAME

This application claims the priority benefit of Korean Patent Application No. 10-2012-0094368, filed on Aug. 28, 2012 in the Korean Intellectual Property Office, the disclosure of which is incorporated by reference in its entirety as if fully set forth herein.

BACKGROUND

The present invention relates to a support frame and a photovoltaic power generation system, and more particularly, to a support frame for fixing and supporting a solar cell panel and a photovoltaic power generation system including the same.

Recently, as existing energy resources such as oil or coal are expected to be exhausted, an interest in alternative energy resources for replacing oil or coal is increasing. In particular, a solar cell that directly converts or transforms solar energy into electricity using a semiconductor element is gaining attention as a next-generation energy device.

A solar cell module including at least one solar cell is fixed to a rack, stand, or support structure in order to form a photovoltaic power generation system. Conventionally, a plurality of holes are formed at the rack, a plurality of holes are also formed at the solar cell module, and screws are fixed to the holes of the rack and the holes of the solar cell module, thereby fixing the solar cell module to the rack. In some cases, additional fixing brackets are used together with the screws. In this instance, holes are formed at the brackets, and the screws are fixed to the holes of the bracket, the holes of the rack, and the holes of the solar cell module, thereby fixing the fixing brackets, the solar cell module, and the rack.

According to the conventional method, lots of processes (such as, a process for forming the plurality of holes, a process for aligning the plurality of holes, a process for fastening the screws to the holes, respectively, and so on) are performed. Also, various components (such as, screws, fixing bracket, and so on) are necessary. Accordingly, fixing the solar cell module to the rack needs much effort and time.

SUMMARY

This disclosure is directed to a photovoltaic power generation system and a support frame thereof to reduce time and cost for fixing a solar cell module to the support frame.

A support frame according to an embodiment is for a photovoltaic power generation system. The support frame comprises a frame member comprising a first portion positioned at a first surface of a solar cell panel and a second portion positioned at a second surface of the solar cell panel, wherein the second portion is openably coupled to the first portion.

A photovoltaic power generation system according to an embodiment comprises a solar cell panel; and a frame member comprising a first portion positioned at a first surface of a solar cell panel and a second portion positioned at a second surface of the solar cell panel, wherein the second portion is openably coupled to the first portion, wherein the solar cell panel is inserted into the support frame when the support frame is open and the solar cell panel is supported by and fixed to the support frame through coupling the first portion and the second portion.

DETAILED DESCRIPTION OF THE PREFERRED EMBODIMENTS

Hereinafter, embodiments of the invention will be described with reference to the accompanying drawings. However, the embodiments of the invention are not limited these embodiments, and various modifications of the embodiments are possible.

In order to clearly and concisely illustrate the embodiments of the invention, members not related to the embodiments of the invention are omitted in the figures. Also, members similar to or the same as each other have the same reference numerals in the figures. In addition, dimensions of layers and regions are exaggerated or schematically illustrated, or some layers are omitted for clarity of illustration. In addition, the dimensions of each part as drawn may not reflect an actual size.

In the following description, when a layer or substrate "includes" another layer or portion, it can be understood that the layer or substrate can further include still another layer or portion. Also, when a layer or film is referred to as being "on" another layer or substrate, it can be understood that the layer of film is directly on the other layer or substrate, or intervening layers may also be present. Further, when a layer or film is referred to as being "directly on" another layer or substrate, it can be understood that the layer or film is directly on the another layer or substrate, and thus, there is no intervening layer.

Hereinafter, a photovoltaic power generation system and a support frame used for the photovoltaic power generation system according to embodiments of the invention will be described with reference to the accompanying drawings.

Figure 1:
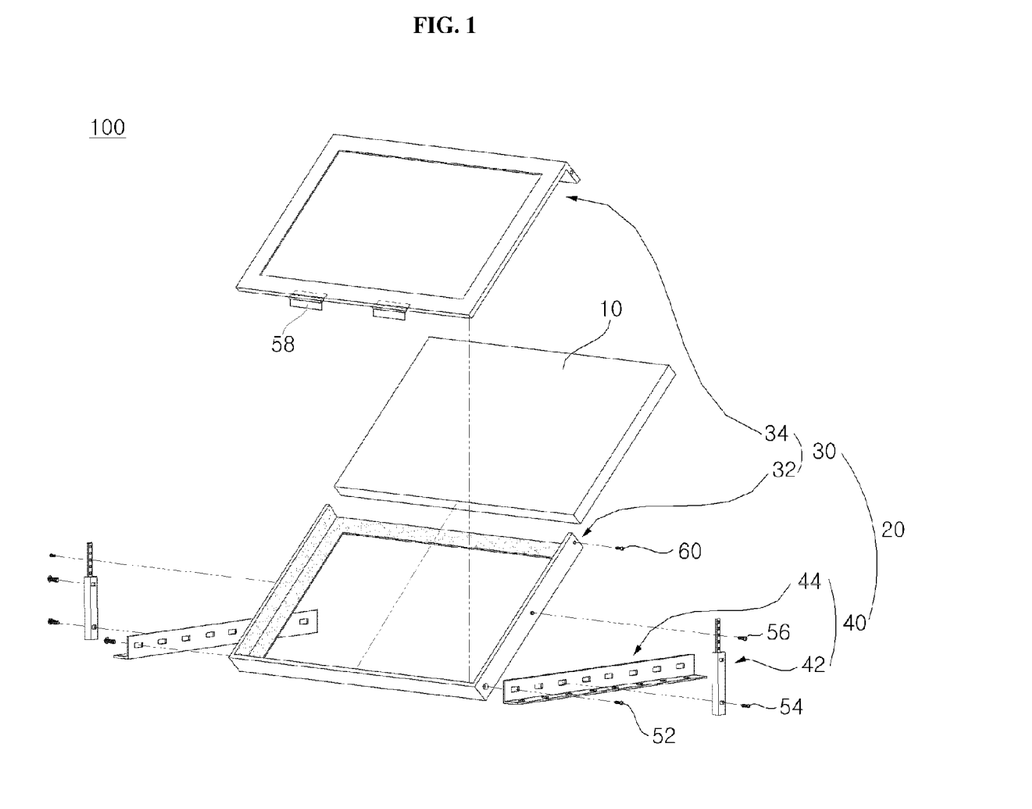
FIG. 1 is an exploded perspective view illustrating a photovoltaic power generation system including a support frame, according to an embodiment of the invention.
Figure 2:
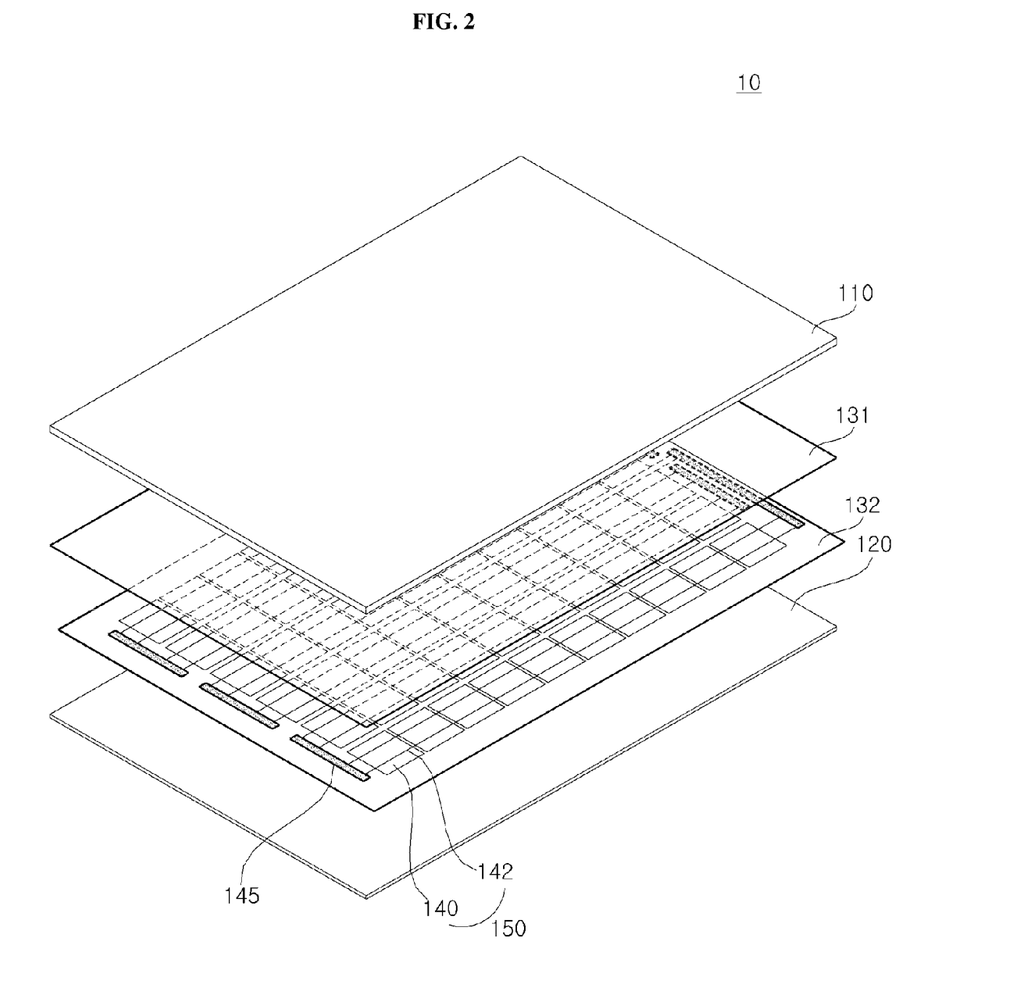
FIG. 2 is an exploded perspective view illustrating an example of a solar cell panel included in the photovoltaic power generation system of FIG. 1.

FIG. 1 is an exploded perspective view illustrating a photovoltaic power generation system including a support frame, according to an embodiment of the invention. FIG. 2 is an exploded perspective view illustrating an example of a solar cell panel included in the photovoltaic power generation system of FIG. 1.

Referring to FIG. 1, a photovoltaic power generation system 100 according to the embodiment includes a solar cell panel 10 and a support frame 20 for fixing and supporting the solar cell panel 10. The support frame 20 includes a frame member 30 that is openable so that the solar cell panel 10 can be inserted into and fixed by the frame member 30. Also, the support frame 20 may further include a support member 40 for supporting the frame member 30 so that the frame member 30 is fixed to the support member 40. This will be described in more detail.

Referring to FIG. 2, the solar cell panel 110 includes at least one solar cell 140 coupled to another. For example, the solar cell 140 may be a silicon solar cell, a dye-sensitized solar cell, a compound semiconductor solar cell, or a tandem solar cell.

In FIG. 2, the solar cell panel 10 including the solar cell 140 of a silicon solar cell type is described as an example. The solar cell panel 10 according to the embodiment may include one or more solar cell strings 150 between a front substrate 110 and a rear substrate 120. The solar cell string 150 includes a plurality of solar cells 140 electrically connected to each other in series, in parallel, or in series-and-parallel arrangement. The solar cell panel 110 may further include a first sealing film 131 disposed between the solar cell string 150 and the front substrate 110, and a second sealing film 132 disposed between the solar cell string 150 and the rear substrate 120.

The front substrate 110 may be made of tempered glass for protecting the solar cells 140 from external shock and allowing solar light to pass. In this instance, the front substrate 110, in order to reduce or prevent solar light from being reflected and to increase transmission of solar light, may be made of low iron tempered glass containing a low iron content. The rear substrate 120 is a layer for protecting the other side of the solar cells 140, and for water-proofing, insulating, and blocking of ultraviolet rays. The rear substrate 120 may have a TPT (Tedlar/PET/Tedlar) type. However, the embodiments of the invention are not limited thereto. Thus, the rear substrate 120 may be a material having high reflectivity in order to reflect solar light entering the front substrate 110 back to the solar cells 140. However, the embodiments of the invention are not limited thereto. Thus, the rear substrate 120 may include a transparent material for allowing solar light to pass in order to realize a bi-facial solar cell panel.

Each of the solar cells 140 may include a silicon substrate of a first conductive type, a second conductive type semiconductor layer, an anti-reflection film, a front electrode, and a rear electrode. The second conductive type semiconductor layer may be formed on the silicon substrate and have a conductive type opposite to the first conductive type. The anti-reflection film may be formed on the second conductive type semiconductor layer, and include at least one opening for exposing a part of the second conductive type semiconductor layer. The front electrode is in contact with the part of the second conductive type semiconductor layer that is exposed through the at least one opening. The rear electrode may be formed on the rear side of the silicon substrate. However, embodiments of the invention are not limited thereto and the solar cells 140 may be different types of solar cells.

The plurality of solar cells 140 may be electrically connected by a ribbon or ribbons 142 to form the solar cell string 150. When a plurality of solar cell strings 150 exist, the plurality of solar cell strings 150 are electrically connected by a bus ribbon or bus ribbons 145. However, the embodiments of the invention are not limited thereto, and only one solar cell 140 may be included depending on a type of the solar cell 140.

The first sealing film 131 and the second sealing film 132 block moisture and/or oxygen that would adversely affect the solar cells 140. The first and second sealing films 131 and 132 may include one or more of various materials. For example, the first sealing film 131 and the second sealing film 132 may be an ethylene-vinyl acetate copolymer resin (EVA) film. However, the embodiments of the invention are not limited thereto, and various other materials may be used for the first and second sealing films 131 and 132.

Referring FIG. 2, the solar cell 140 having the silicon solar cell type is described as an example. However, the embodiment of the invention is not limited thereto. Accordingly, a structure and a shape of the solar cell panel 10 may be varied.

Referring to FIG. 1 again, the support frame 20 for fixing and supporting the solar cell panel 10 may include the frame member 30 where the solar cell panel 10 is inserted and the support member 40 for fixing and supporting the frame member 30. In this instance, the frame member 30 may include a first portion 32 and a second portion 34. The first portion 32 is positioned at one surface (for example, a rear surface) of the solar cell panel 10 and is fixed to the support member 40. The second portion 32 is positioned at the other surface (for example, a front surface) of the solar cell panel 10, and is openably fixed to the first portion 32. Also, the support member 40 may include a ground portion 42 and a vertical portion 44. An end of the frame member 30 (more particularly, the first portion 32) is fixed to the ground portion 32. The other end of the frame member 30 (more particularly, the first portion 32) is fixed to the vertical portion 44. This will be described in more detail with reference to FIG. 3.

Figure 3:
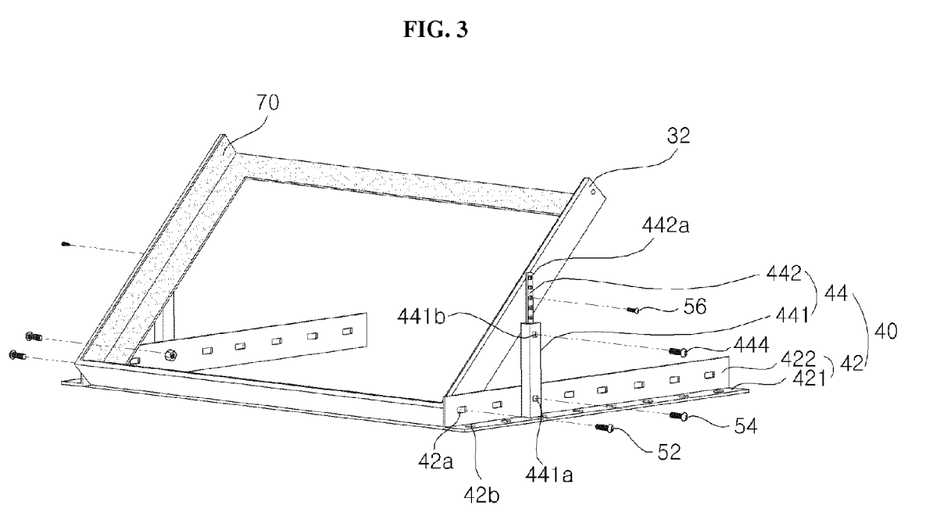
FIG. 3 is a perspective view illustrating a support member and a first portion of a frame member of the photovoltaic power generation system shown in FIG. 1.

FIG. 3 is a perspective view illustrating the support member 40 and the first portion 32 of the frame member 30 of the photovoltaic power generation system 100 shown in FIG. 1. In order to clearly and concisely illustrate the embodiment of the present invention, the first portion 32 of the frame member 30 is shown and the second portion 34 of the frame member 30 is not shown in FIG. 3.

Referring to FIG. 3, in the embodiment, one support member 40 is positioned at one side of the frame member 30, and another support member 40 is positioned at the other side of the frame member 30. Each support member 40 may includes the ground portion 42 and the vertical portion 44. The ground portion 42 is parallel to the ground so that the support member 40 can be stably positioned on the ground. The vertical portion 44 is vertically connected to the ground portion 42 so that a length of the vertical portion 44 can be varied.

In the embodiment, two support members 40 are positioned at the both lateral sides of the frame member 30, and two ground portions 42 of the support member 40 are positioned at the both sides of the frame member 30 to be parallel to each other. Accordingly, an amount of material for forming the ground portion 42 can be reduced, thereby minimizing the cost. However, the embodiment of the invention is not limited thereto. Accordingly, the ground portion 42 may have a continuously-connected shape. That is, an additional ground portion connecting two ground portions 42 may be formed at one side and/or both sides (a front side and/or a back side of FIG. 3) In this instance, the ground portion 42 may be integrally formed and may have a "U" shape or a quadrangle shape. Then, a number of components of the ground portion 42 can decrease, and the ground portion 42 can be conveniently moved. The shape of the ground portion 42 may be varied other than the above.

The ground portion 42 may include a portion 421 parallel to the ground and a portion 422 perpendicular to the ground. Thus, the ground portion 42 may have a cross-section of an "L" shape. The ground portion 42 can be stably fixed to the ground by the portion 421 parallel to the ground. Also, an area where the vertical portion 44 and the frame member 30 are mounted can be provided by the portion 422 perpendicular to the ground.

First through holes 42a may be formed at the ground portion 42 so that first and second fasteners 52 and 54 for fixing the ground portion 42 to the vertical portion 44 and the first portion 32 can be fastened. In this instance, a plurality of first through holes 42a may be spaced apart from each other at regular intervals in a longitudinal direction of the portion 422 perpendicular to the ground. Using the plurality of first through holes 42a, the fixing positions of the first portion 32 and the vertical portion 44 can be freely adjusted. Accordingly, the first portion 32 can be positioned at an optimal location in consideration of the environment of an area where the photovoltaic power generation system 100 is mounted.

For example, the first fastener 52 for fixing with the first portion 32 may be fixed at one of the plurality of the first through holes 42a positioned at one side (for example, the first through hole 42a positioned at the left side of the drawing). That is, ground portions 42 are positioned at both lateral sides of one end portion (a lower portion of the drawing) of the first portion 32, respectively, and then, each of the first fasteners 52 is inserted through the first through hole 42a and a third through hole (32a of FIG. 4). Then, both lateral sides of the lower portion of the first portion 32 can be fixed to the ground portion 42.

In addition, the second fastener 54 for fixing with the vertical portion 44 may be fixed at another first through hole 42a spaced apart from the first through hole 42a where the first fastener 52 is fixed. That is, the vertical portion 44 is in contact with the portion 422 perpendicular to the ground, and then, the second fastener 54 is inserted through the first through hole 42a and a fourth through hole 441a formed at the first portion 32. Then, the ground portion 42 and the vertical portion 44 can be fixed to each other.

Various elements that can stably fix the ground portion 42, the vertical portion 44, and the first portion 32 may be used for the first and second fasteners 52 and 54. For example, bolts, nuts, rivets, and so on may be used for the first and second fasteners 52 and 54.

However, the embodiment of the invention is not limited thereto. Thus, various structure and methods, besides the first through hole 42a and the first and second fasteners 52 and 54, may be used for fixing the ground portion 42, the vertical portion 44, and the first portion 32.

In the embodiment, a plurality of second through holes are formed at the portion 421 of the ground portion 42 parallel to the ground 21 42b to be spaced apart from each other in a longitudinal direction. The ground portion 42 and the ground can be fixed to each other by the second through holes 42b. Also, a manufacturing cost of the ground portion 42 can be reduced by the second through holes 42b. However, the embodiment of the invention is not limited thereto. It is possible that the second through holes 42b are not formed.

Each of the vertical portions 44 can be fixed to each of the ground portions 42 at one portion. The other portion (the upper portion of the drawing) of the first portion 32 can be fixed to an upper portion of the vertical portion 44. This will be described in more detail.

In the embodiment, the vertical portion 44 may include a vertical fixing portion 441 fixed to the ground portion 42, and a vertical movement portion 442 is mounted on the vertical fixing portion 441. The vertical movement portion 442 can be vertically moved. The vertical fixing portion 441 may have a pipe shape having an inner hollow. The vertical movement portion 442 may have the same shape as the vertical fixing portion 441 and has a smaller cross-section than the vertical fixing portion 441 so that the vertical movement portion 442 can be positioned inside the vertical fixing portion 441.

A plurality of fifth through holes 442a are formed at the vertical movement portion 442 in a longitudinal direction to be spaced from each other. The plurality of fifth through holes 442 may be formed for fixing with the vertical fixing portion 441 and the first portion 32.

A third fastener 56 is inserted through one among the plurality of fifth through holes 442a and a sixth through hole 32b of the first portion 32 to fixes the first portion 32 and the vertical portion 44. Various elements that can stably fix the vertical portion 44 and the first portion 32 may be used for the third fastener 56. For example, bolts, nuts, rivets, and so on may be used for the third fastener 56. However, the embodiment of the invention is not limited thereto. Thus, various structure and methods, besides the fifth through hole 442a and the third fastener 56, may be used for fixing the vertical portion 44 and the first portion 32.

A seventh through hole 441b can be formed at the upper portion of the vertical fixing portion 441 to correspond to the fifth through hole 442a. The location fixing element 444 can be inserted through the fifth through hole 442a and the seventh through hole 441b and fixes the vertical location of the vertical movement portion 442. That is, when the vertical movement portion 442 is positioned at the unwanted location, the location fixing element 444 is loosen. In this state, the vertical movement portion 442 is vertically moved to be positioned at the wanted portion, and the location fixing element 444 is inserted again through the fifth through hole 442a and the seventh through hole 441b. Thereby, the vertical movement portion 442 can be positioned at the wanted portion.

In the embodiment, the vertical portion 44 may include the vertical fixing portion 441 and the vertical movement portion 442, and thus, an inclined angle of the frame member 30 can be adjusted or controlled by using the location fixing element 444, even after installing the frame member 30. Accordingly, the inclined angle of the frame member 30 can be conveniently controlled so that the solar cell panel 10 can receive the most amount of light according to a position of a light source such as sun. Thereby, the efficiency of the photovoltaic power generation system 100 can be enhanced.

However, the embodiment of the invention is not limited thereto. Thus, the vertical fixing portion 441 may be included only without the vertical movement portion 442. In this instance, in order to adjust the inclined angle of the frame member 30, the position of the third fastener 56 for fixing the first portion 32 and the vertical portion 44 may be changed, or the position of the first fastener 54 for fixing the ground portion 42 and the vertical portion 44 may be changed. Alternatively, a whole portion of the vertical portion 44 may be vertically moved.

As in the above, both lateral sides of the lower portion of the first portion 32 are fixed to the portion 422 of the ground portion 42 perpendicular to the ground, and both lateral sides of the upper portion of the first portion 32 is fixed to the vertical portion 44. Thus, the first portion 32 can be fixed and supported without movement when the movement is not necessary. In this state, the second portion 34 is rotatably fixed to the first portion 32, and thus, the frame member 30 can be open and coupled as necessary. The frame member 30 will be described in more detail with reference to FIG. 4.

Figure 4:
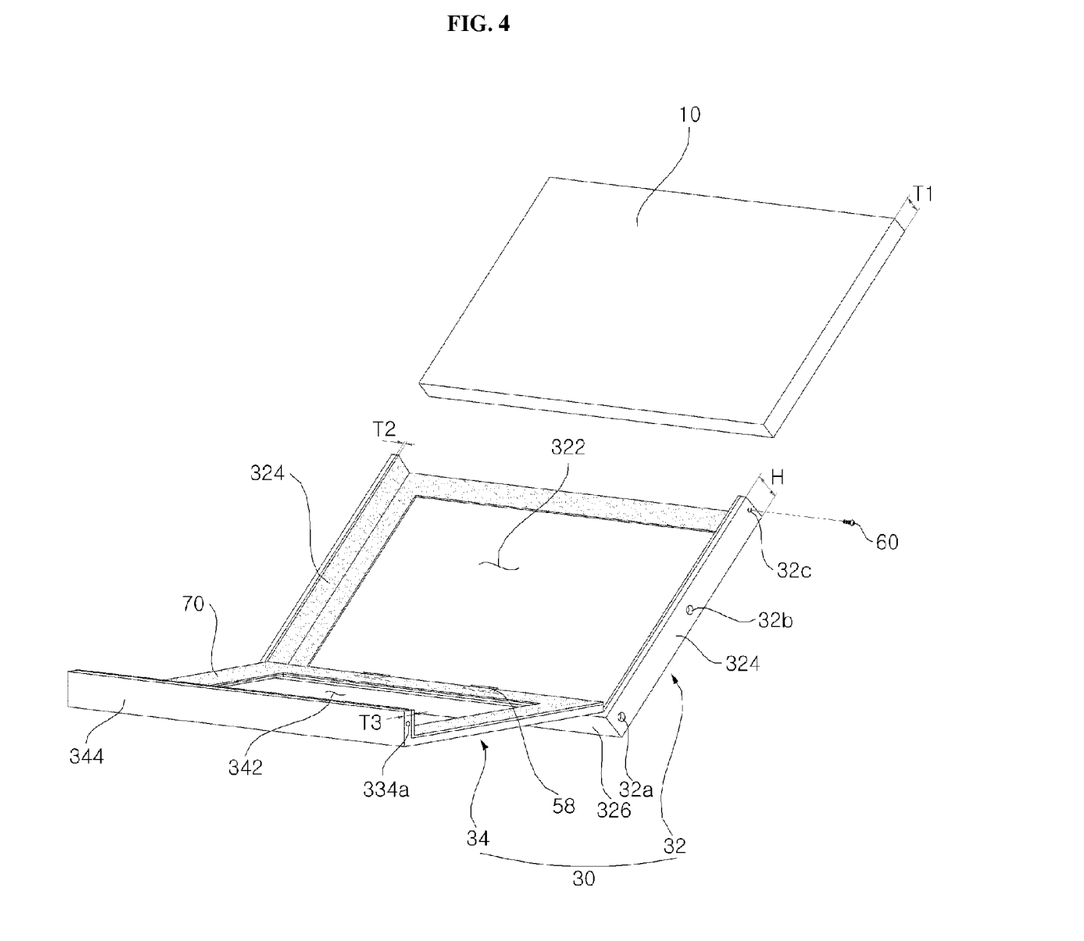
FIG. 4 is an exploded perspective view of the solar cell panel and the frame member of the photovoltaic power generation system shown in FIG. 1.

FIG. 4 is an exploded perspective view of the solar cell panel 10 and the frame member 30 of the photovoltaic power generation system 100 shown in FIG. 1.

Referring to FIG. 4, the first portion 32 of the frame member 30 may be formed along edges of the back surface of the solar cell panel (10 of FIG. 1). That is, the first portion 32 has a shape similar to a frame having an opening portion 322. The sun light can be incident through the opening portion 322. Thus, a bi-facial solar cell panel 10 can be used, and the weight and the cost of the frame member 30 can be reduced. However, the embodiment of the invention is not limited thereto. Thus, the first portion 32 may not include the opening portion 322. In this instance, the first portion 32 may have a planer shape and may entirely cover the back surface of the solar cell panel 10.

In addition, the second portion 34 of the frame member 30 may be formed along edges of the front surface of the solar cell panel 10. That is, the second portion 34 has a shape similar to a frame having an opening portion 342. The sun light can be incident through the opening portion 342.

In order to rotatably fix the second portion 34 to the first portion 32, the second portion 34 may be hinge-coupled to the first portion 32, for example, by a rotation fixing element 58. In the embodiment, the first portion 32 and the second portion 34 can be hinge-coupled by the rotation fixing element 58 having one or more hinge of various types, such as a butt type, a continuous type, a barrel type, and the like.

In the embodiment, the guide portion 324 is positioned at both lateral sides of the first portion 32 for guiding the solar cell panel 10 when the solar cell panel 10 is inserted. Accordingly, the solar cell panel 10 can be stably positioned when the solar cell panel 10 is inserted and the first and second portions 32 and 34 are coupled. Particularly, the guide portion 324 is formed at the first portion 32 that is immovably fixed to the support member 40, and thus, the solar cell panel 10 can be stably inserted more. In this instance, the guide portion 324 may consist of both side surfaces of the first portion 32, thereby minimizing a volume of the frame 30.

Also, a bottom portion 326 supporting the bottom side of the solar cell panel 10 may be formed at the lower portion of the first portion 32. Then, the solar cell panel 10 can lie stably.

Heights H of the guide portion 324 and the bottom portion 326 may be substantially same as a thickness T1 of the solar cell panel 10. That is, the heights H of the guide portion 324 and the bottom portion 326 may be same as the thickness T1 of the solar cell panel 10. When a cushioning member 70 is positioned between the frame member 30 and the solar cell panel 10, the heights H of the guide portion 324 and the bottom portion 326 may be larger than the thickness T1 of the solar cell panel 10 by a thickness T2 of the cushioning member 70. Then, the frame member 30 can be in close contact with and be fixed to the solar cell panel 10, and the solar cell panel 10 can be more stably fixed.

However, the embodiment of the invention is not limited thereto. Thus, the guide portion 324 may be formed at the second portion 34 or at both of the first and second portions 32 and 34. Also, the guide portion 34 may be spaced apart from the both lateral edges of the first and/or second portions 32 and 34. That is, various modifications are possible. In addition, the bottom portion 326 may be formed at the second portion 34 or at both of the first and second portions 32 and 34. Various modifications besides the above are possible.

A cover portion 344 may be formed at the upper edge of the second portion 34. The cover portion 344 and the guide portion 326 are fastened by the fastener 60. In the embodiment, bolts or rivets are used for the fastener 60 as an example. That is, the fastener 60 is fastened to an eighth through hole 32c formed at the guide portion 342 and a ninth through hole 334a formed at the cover portion 344. Thereby, the first portion 32 and the second portion 34 can be coupled.

In this instance, the cover portion 344 has a thickness T3 larger than that of other portions so that the fastener 60 can be stably coupled to the cover portion 344 and the guide portion 326. However, the embodiment of the invention is not limited thereto. That is, the fastener 60 may be inserted from the back side of the first portion 32 to fasten the cover portion 344 and the first portion 32. Also, the fastener besides the bolt and the rivets may be used, and this will be described in more detail with reference to FIG. 5a and FIG. 5b.

In the embodiment, the frame member 30 may include a resin material that does not damage the solar cell panel 10 and has a rigidity or a hardness for fixing the solar cell panel 10. For example, the frame member 30 may include a fiber reinforced plastic material. Then, the frame member 30 can stably support the solar cell panel 10 and can prevent the solar cell panel 10 from being impacted.

In this instance, in order to prevent further damage of the solar cell panel 10, the cushioning member 70 may be further positioned between the frame member 30 and the solar cell panel 10. The cushioning member 70 may be formed on the frame member 30 to have a simple structure. The cushioning member 70 protects the solar cell panel 10 from being impacted when the solar cell panel 10 is inserted or after the solar cell panel 10 is inserted.

In the embodiment, for example, the cushioning members 70 are formed on an inner surface of the first portion 32, an inner surface of the second portion 32, an inner surface of the guide portion 324, an inner surface of the bottom portion 326, and an inner surface of the cover portion 344. However, the embodiment of the invention is not limited thereto. The cushioning members 70 may be formed on at least one of the inner surface of the first portion 32, the inner surface of the second portion 32, the inner surface of the guide portion 324, the inner surface of the bottom portion 326, and the inner surface of the cover portion 344.

The cushioning member 70 covers portions where the first and third fasteners 52 and 56, the rotation fixing element 58, and the fastener 60 are positioned. The cushioning member 70 protects the solar cell panel 10 from being impacted by the first and third fasteners 52 and 56, the rotation fixing element 58, and the fastener 60.

The cushioning member 70 may include a rubber material. For example, the cushioning member 70 may be positioned on the frame member 30 by using a tape including ethylene propylene diene monomer (EPDM).

A coupling method of the photovoltaic power generation system 100 (that is, a method for mounting the solar cell panel 10 on the support frame 20) is as follows.

The frame member 30 is open by separating the upper portion of the second portion 34 from the upper portion of the first portion 32 in the state the first portion 32 is fixed to the support member 40. And then, the solar cell panel 10 is inserted at an appropriated position by using the guide portion 324. And then, the second portion 34 moves to be close to the first portion 32 and the solar cell panel 10 by rotating the second portion 34, and the second portion 34 and the first portion 32 are fixed by using the fastener 60. Then, the frame member 30 is close and the solar cell panel 10 is fixed inside the frame member 30.

The conventional frame member is fixed to the outer portion of the solar cell panel and is not detachable to the solar cell panel. Accordingly, the frame member and the support frame are separated from each other. Thus, in order to fix the frame member that is integral with the solar cell panel to a support frame such as a rack, a plurality holes are formed at both of the frame member and the support frame at positions corresponding to each other, and bolts and the like are fastened to the plurality holes. According to this conventional method, the holes should be formed at the frame member and the support frame, and the holes of the frame member and the holes of the support frame should be fastened one by one. Accordingly, a step of mounting the frame member on the solar cell panel, a step of aligning the holes of the frame member and the holes of the support frame, and so on should be performed. That is, lots of time and effort is necessary. Thus, mounting time and cost increase, thereby reducing productivity of the photovoltaic power generation system.

On the other hand, in the embodiment, the support frame 20 includes the frame member 30, and thus, additional frame member mounted on the solar cell panel 10 for fixing the solar cell panel 10 to the support frame 20 is not necessary. Thus, the time and cost for mounting the additional frame member can be reduced. Also, when the solar cell panel 10 is moved before it is mounted on the support frame 20, damage of the solar cell panel 10 by the additional frame member can be prevented.

Further, the solar cell panel 10 is inserted in the state that the frame member 30 is open, and the solar cell panel 10 is fixed by closing and fixing the frame member 30. Thus, a step of forming a plurality of holes, a step of aligning the holes, and a step of fastening fasteners to the holes can be eliminated. Accordingly, the time and cost for mounting the solar cell panel 10 to the support frame 20 can be largely reduced.

Hereinafter, a support frame and a photovoltaic power generation system including the same according to another embodiment of the invention are described in detail with reference to FIG. 5a and FIG. 5b. In the following embodiments, since a frame member is different from the above frame, corresponding portions of FIG. 4 are only shown in FIG. 5a and FIG. 5b. Other portions have a structure the same as or similar to that of the above embodiment.

Figure 5A:
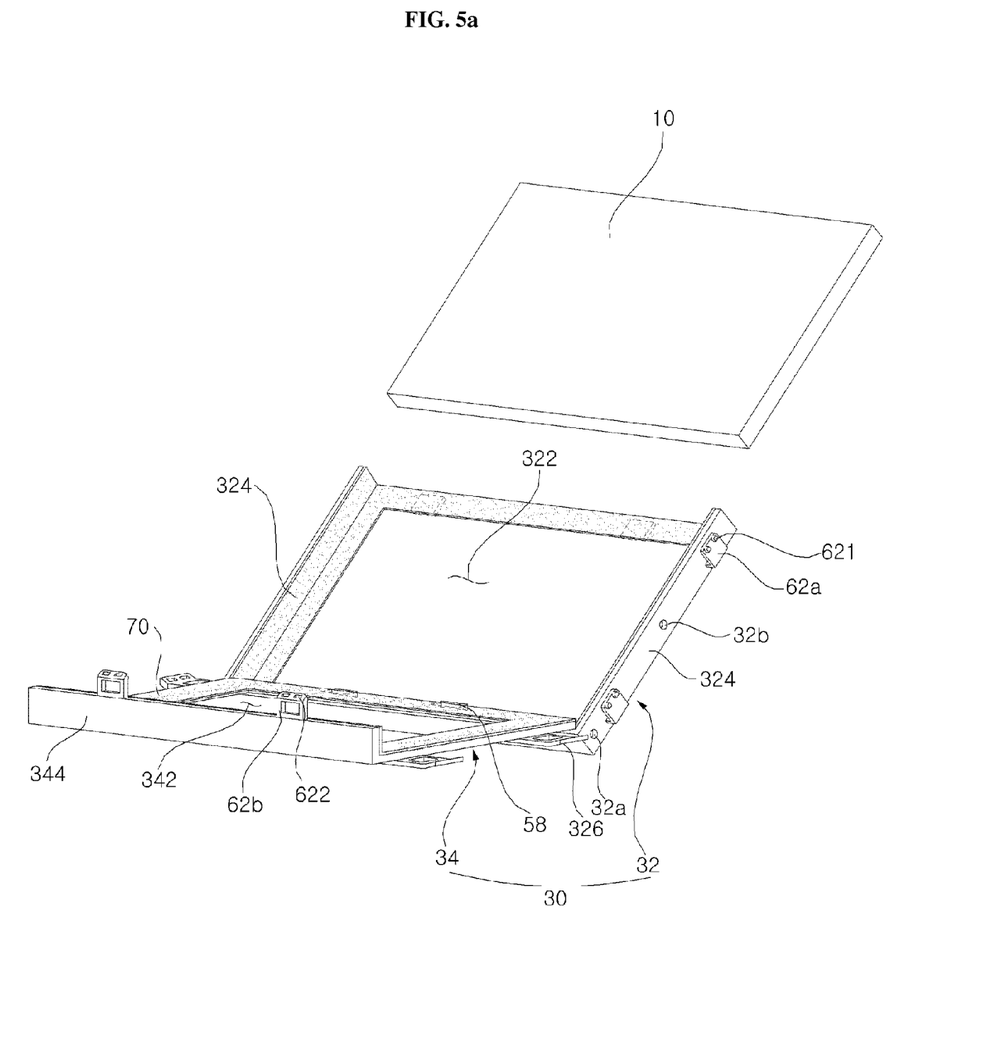
FIG. 5a is a perspective view of a frame member of a photovoltaic power generation system according to another embodiment, when the frame member is open.
Figure 5B:
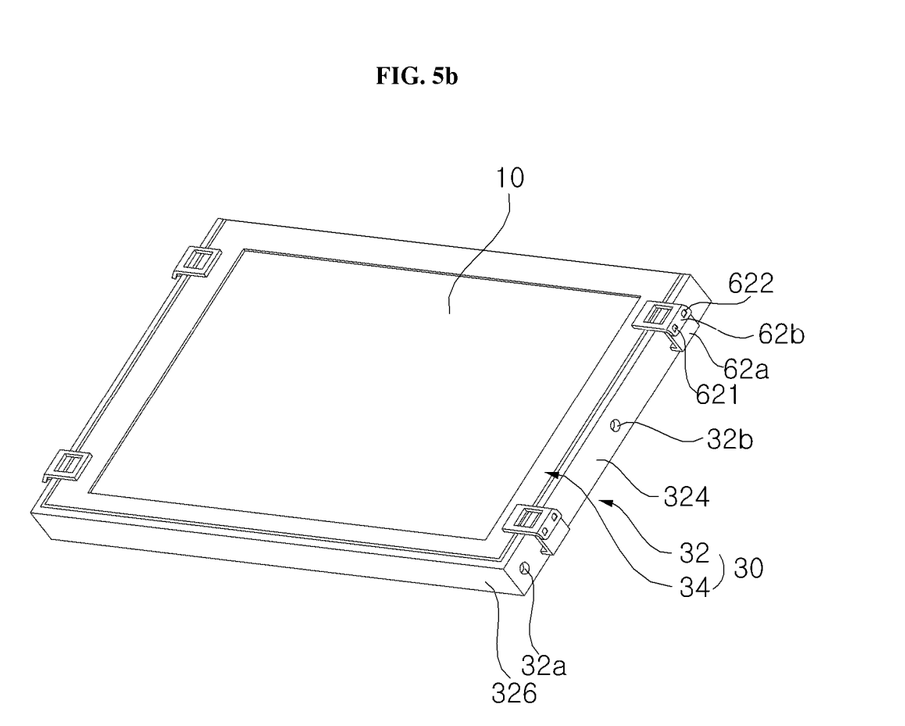
FIG. 5b is a perspective view of a frame member of the photovoltaic power generation system according to another embodiment, when the frame member is closed.

FIG. 5a is a perspective view of a frame member of a photovoltaic power generation system according to another embodiment, when the frame member is open, and FIG. 5b is a perspective view of the frame member of the photovoltaic power generation system according to another embodiment, when the frame member is close.

Referring to FIG. 5a and FIG. 5b, in the embodiment, a first portion 32 and a second portion 34 of a frame member 30 are openably and detachably coupled to each other by using fasteners 62a and 62b. That is, the fasteners 62a and 62b (including a first fastener 62a formed at the first portion 32 and a second fastener 62b formed at the second portion 34) can be coupled to each other by pressing, the first portion 32 and the second portion 34 can be fixed to each other.

In the embodiment, for example, the first fasteners 62a are formed at the back surfaces of the guide portion 324 and the first portion 32, and the second fasteners 62b are formed to correspond to the first fasteners 62a. In this instance, a plurality of first fasteners 62a are formed at each edge to be symmetric to each other, and a plurality of second fasteners 62b are formed at the each edge to be symmetric to each other to correspond to the first fasteners 62a. Then, the first portion 32 and the second portion 34 can be more stably coupled.

In this instance, for example, the first fastener 62a includes an engaging hook 621, and the second fastener 62b includes an engaging slit (or an engaging groove) 622 where the engaging hook 621 is engaged. However, the embodiment of the invention is not limited thereto, and various structures may be used.

As shown in FIG. 5a, the solar cell panel 10 is inserted in the state that the first portion 32 and the second portion 34 of the frame member 30 are open. And then, as shown in FIG. 5b, the second portion 34 is positioned on the solar cell panel 10 by rotating the second portion 34, and the engaging slit 622 of the second fastener 62a is engaged with the engaging hook 621 of the first fastener 62a by pressing the second fastener 62b on the first fastener 62a in the state the second fastener 62b is positioned on the first faster 62a. Also, when inspection or the replacement of the solar cell panel 10 is necessary, the second fastener 62b is separated from the first fastener 62a, the second portion 34 is rotated to be separated from the first portion 32, and the first portion 32 and the second portion 34 are open.

The fasteners 62a and 62b for fastening the first portion 32 and the second portion 34 are coupled by pressing, and thus, opening and closing of the first portion 32 and the second portion 34 can be easy. Accordingly, time for mounting or replacing the solar cell panel 10 can be reduced.

Certain embodiments of the invention have been described. However, the invention is not limited to the specific embodiments described above; and various modifications of the embodiments are possible by those skilled in the art to which the invention belongs without leaving the scope defined by the appended claims.

What is claimed is:

1. A support frame for a photovoltaic power generation system, wherein a solar cell panel is insertable into and fixed by the support frame, wherein a solar cell panel including a solar cell, a front substrate disposed on a front surface of the solar cell, a rear substrate disposed on a rear surface of the solar cell, a first sealing film positioned between the solar cell and the front substrate, and a second sealing film positioned between the solar cell and the rear substrate, wherein the support frame comprising:

a frame member comprising a first portion to position at a first surface of the solar cell panel and a second portion to position at a second surface of the solar cell panel, and the second portion having an opening to expose the second surface of the solar cell panel such that sunlight can be incident through the opening of the second portion, wherein a first side of the first portion and a first side of the second portion are hinged-coupled such that the first portion is rotatably coupled with the second portion with respect to the first side of the first portion and the second portion, and the second portion opens and closes on the first portion, wherein at least one of the first portion and the second portion comprises a guide portion for guiding the solar cell panel during insertion such that the solar cell panel is inserted by sliding into the support frame from a second side of the first portion opposite to the first side of the first portion or a second side of the second portion opposite to the first side of the second portion, a support member where the frame member is fixed, the support member to make contact with ground when the support frame is placed on the ground, wherein the support member supports the frame member to be inclined from the ground, wherein when the first portion and the second portion are coupled with respect to each other, all sides of the solar cell panel are covered by the first portion and the second portion with the second surface of the solar cell panel exposed through the opening of the second portion.

2. The support frame according to claim 1, wherein at least one of the first portion and the second portion is formed along an edge of the solar cell panel.

3. The support frame according to claim 1, further comprising:
a fastener for fastening the second side of the first portion with the second side of the second portion.

4. The support frame according to claim 3, wherein the fastener comprises a bolt.

5. The support frame according to claim 1, wherein the guide portion is positioned at a side surface of the at least one of the first portion and the second portion, and
the guide portion has a height the same as or larger than a thickness of the solar cell panel.

6. The support frame according to claim 1, wherein the frame member comprises a fiber reinforced plastic material.

7. The support frame according to claim 1, further comprising:
a cushioning member positioned on an inner surface of the frame member where the solar cell panel is positioned.

8. The support frame according to claim 7, wherein the cushioning member comprises a rubber material.

9. The support frame according to claim 8, wherein the cushioning member comprises ethylene propylene diene monomer (EPDM).

10. The support frame according to claim 1, wherein the support member comprises a ground portion and a vertical portion perpendicularly connected to the ground portion.

11. The support frame according to claim 10, wherein the first side of the first portion is fixed to a first side of the ground portion, and
the second side of the first portion is fixed to an upper end portion of the vertical portion.

12. The support frame according to claim 11, wherein a length of the vertical portion is variable, and
an inclined angle of the frame member is adjusted by variation of the length of the vertical portion.

13. The support frame according to claim 1, wherein the first portion is fixed to the support member,
wherein the first portion comprises a plurality of guide portions formed at both lateral sides of the first portion for guiding the solar cell panel when the solar cell panel is inserted, and the first side of the first portion for supporting a lower portion of the solar cell panel, and wherein the second portion comprises a top side that positions on the second surface of solar cell panel and the second side the covers an upper portion of the solar cell panel.

14. The support frame according to claim 1, wherein the first portion having an opening to expose the first surface of the solar cell panel such that sunlight can be incident through the opening of the first portion.

15. A photovoltaic power generation system, comprising:
a solar cell panel including a solar cell, a front substrate disposed on a front surface of the solar cell, a rear substrate disposed on a rear surface of the solar cell, a first sealing film positioned between the solar cell and the front substrate, and a second sealing film positioned between the solar cell and the rear substrate; and
a frame member comprising a first portion positioned at a first surface of the solar cell panel and a second portion positioned at a second surface of the solar cell panel and the second portion having an opening to expose the second surface of the solar cell panel such that sunlight can be incident through the opening of the second portion, wherein the second portion is openably coupled to the first portion,
wherein the solar cell panel is inserted into the support frame when the support frame is open and the solar cell panel is supported by and fixed to the support frame through coupling the first portion and the second portion,
wherein a first side of the second portion is rotatably coupled to a first side of the first portion, and a second side opposite of the first side of the first portion is openably coupled to a second side opposite of the first side of the second portion,
wherein the first side of the first portion and the first side of the second portion are hinged-coupled, and
wherein at least one of the first portion and the second portion comprises a guide portion for guiding the solar cell panel during insertion such that the solar cell panel is inserted by sliding into the support frame from the second side of the first portion or the second side of the second portion,
a support member for fixing the frame member,
wherein the support member supports the frame member to be inclined from ground when the frame member is placed on the ground,
wherein the hinged coupled first and second portions are located where the frame member and the support member are coupled.

16. The photovoltaic power generation system according to claim 15, wherein the first portion having an opening to expose the first surface of the solar cell panel such that sunlight can be incident through the opening of the first portion.

* * * * *